(12) United States Patent
Park et al.

(10) Patent No.: US 6,596,581 B2
(45) Date of Patent: Jul. 22, 2003

(54) METHOD FOR MANUFACTURING A SEMICONDUCTOR DEVICE HAVING A METAL-INSULATOR-METAL CAPACITOR AND A DAMASCENE WIRING LAYER STRUCTURE

(75) Inventors: Byung-lyul Park, Seoul (KR); Ju-hyuk Chung, Suwon (KR); Ja-hyung Han, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/196,412

(22) Filed: Jul. 17, 2002

(65) Prior Publication Data

US 2003/0027385 A1 Feb. 6, 2003

(30) Foreign Application Priority Data

Aug. 1, 2001 (KR) .............................. 01-46517

(51) Int. Cl.$^7$ ................. H01L 21/8242; H01L 21/4763
(52) U.S. Cl. ................. 438/253; 438/396; 438/393; 438/250; 438/618
(58) Field of Search ................ 438/253–256, 438/396–399, 3

(56) References Cited

U.S. PATENT DOCUMENTS

| | | | | |
|---|---|---|---|---|
| 6,232,197 B1 | * | 5/2001 | Tsai ............................ | 438/393 |
| 6,320,244 B1 | * | 11/2001 | Alers et al. .................. | 257/534 |
| 6,329,234 B1 | * | 12/2001 | Ma et al. ..................... | 438/210 |
| 6,333,224 B1 | * | 12/2001 | Lee ............................. | 438/243 |
| 6,338,999 B1 | * | 1/2002 | Hsue et al. ................. | 438/253 |

* cited by examiner

*Primary Examiner*—John F. Niebling
*Assistant Examiner*—Jennifer M. Kennedy
(74) *Attorney, Agent, or Firm*—Lee & Sterba, P.C.

(57) ABSTRACT

A method for manufacturing a semiconductor device having a metal-insulator-metal (MIM) capacitor and a damascene wiring layer structure, wherein first and second metal wiring layers are formed in a lower dielectric layer on a semiconductor substrate such that top surfaces of the first and second metal wiring layers and the lower dielectric layer are level. First and second dielectric layers are sequentially formed to have a hole exposing the top surface of the second metal wiring layer. An upper electrode of a capacitor is formed in the hole region such that the top surfaces of the upper electrode and the second dielectric layer are level. Third and fourth dielectric layers are sequentially formed on the substrate. A damascene structure is formed to contact the top surface of the first metal wiring layer, and a contact plug is formed to contact the top surface of the upper electrode.

38 Claims, 11 Drawing Sheets

METHOD FOR MANUFACTURING A SEMICONDUCTOR DEVICE HAVING A METAL-INSULATOR-METAL CAPACITOR AND A DAMASCENE WIRING LAYER STRUCTURE

BACKGROUND OF THE INVENTION

1. Field of the Invention

The present invention relates to a method for manufacturing a semiconductor device. More particularly, the present invention relates to a method for manufacturing a semiconductor device having a metal-insulator-metal capacitor and a damascene wiring layer structure.

2. Description of the Related Art

As the integration density of semiconductor devices increases, a metal wiring layer process becomes more important in determining the performance and reliability of semiconductor devices. Recently, aluminum (Al) has been primarily used as a wiring layer material. Aluminum (Al) has a relatively low resistivity of about 3–4 $\mu\Omega$-cm and may be easily manipulated. However, as the line width of wiring layers decreases while the length of wiring layers increases, a material having a resistivity lower than that of aluminum is needed.

Copper (Cu) is the most promising substitute for aluminum in highly-integrated circuits because copper has a very low resistivity of about 1.7 $\mu\Omega$-cm. In addition, copper has superior electromigration resistance. Accordingly, even if the cross-sectional area of copper wiring layers continues to decrease, the operational speed and reliability of semiconductor devices may be maintained. However, it is difficult to pattern copper wiring layers using photolithography, and thus a dual damascene process is used to form such copper wiring layers.

In a conventional method for manufacturing metal wiring layers, a metal is deposited first and then is patterned by photolithography, thereby forming an interlayer insulating layer. In the damascene process, however, an interlayer insulating layer is formed first, a trench, which corresponds to a metal wiring layer region and a via, is formed, and then the trench is filled with metal. More specifically, in a dual damascene process, a metal wiring layer region trench and a via trench are formed by performing two photolithographic processes and two etching processes and then are chemically and mechanically polished, thereby forming a metal wiring layer region and a via.

In order to apply the dual damascene process to the formation of copper wiring layers in a semiconductor device required to include a metal-insulator-metal (MIM) capacitor between metal wiring layers, it is necessary to develop a new manufacturing method.

FIGS. 1 and 2 illustrate cross-sectional views of stages of a conventional method for manufacturing a semiconductor device having a MIM capacitor and a damascene wiring layer structure. Referring to FIG. 1, a first metal wiring layer 15 and a second metal wiring layer 20 are formed on a lower dielectric layer 10, which is formed on a semiconductor substrate 1, such that there is no step difference between the lower dielectric layer 10 and the first and second metal wiring layers 15 and 20 (i.e., top surfaces of the first and second metal wiring layers 15 and 20 are level with a top surface of the lower dielectric layer 10). Next, a first metal layer is formed on the semiconductor substrate 1, on which the first and second metal wiring layers 15 and 20 are formed. The first metal layer is patterned, thereby forming a lower electrode 25 of a capacitor to contact the top surface of the second metal wiring layer 20. Next, a dielectric layer 30 is formed on the semiconductor substrate 1, on which the lower electrode 25 is formed. Then, a second metal layer is formed on the dielectric layer 30 and then is patterned, thereby forming an upper electrode 35 of a capacitor at a position corresponding to the position of the lower electrode 25. Next, an interlayer insulating layer 40 is formed on the semiconductor substrate 1, on which the upper electrode 35 is formed.

Referring to FIG. 2, a top surface of the interlayer insulating layer 40 is planarized by chemical mechanical polishing (CMP). Next, the interlayer insulating layer 40 and the dielectric layer 30 are etched, thereby forming a via hole $V_1$ to expose the top surface of the first metal wiring layer 15. A first trench $T_1$ is formed over the via hole $V_1$ and a second trench $T_2$ is formed to expose a top surface of the upper electrode 35. Next, the via hole $V_1$ and the first and second trenches $T_1$ and $T_2$ are filled with copper and then are chemically and mechanically polished, thereby forming a damascene wiring layer structure 45 and a contact plug 50.

However, such a conventional method has the following problems. First, in the step of patterning the second metal layer to form the upper electrode 35, the dielectric layer 30 may be damaged by plasma, thereby impairing the performance of a MIM capacitor.

Second, in order to decrease a step difference between the lower electrode 25 and the upper electrode 35, a step of chemically and mechanically polishing the top surface of the interlayer insulating layer 40 is necessary. In other words, in addition to planarizing the copper filling the via hole $V_1$ and the first and second trenches $T_1$ and $T_2$ by CMP, a step of performing a CMP process on the interlayer insulating layer 40 is also required.

SUMMARY OF THE INVENTION

In an effort to solve the above-described problems, it is a first feature of an embodiment of the present invention to provide a method for manufacturing a semiconductor device having a MIM capacitor and a damascene wiring layer structure without damaging a dielectric layer.

It is a second feature of an embodiment of the present invention to provide a method for manufacturing a semiconductor device having a MIM capacitor and a damascene wiring layer structure without having to perform CMP on an interlayer insulating layer.

Accordingly, to provide the above features, there is provided a method for manufacturing a semiconductor device having a MIM capacitor and a damascene wiring layer structure according to a first embodiment of the present invention, wherein a first metal wiring layer and a second metal wiring layer are formed in a lower dielectric layer on a semiconductor substrate such that top surfaces of the first and second metal wiring layers are level with a top surface of the lower dielectric layer. A first dielectric layer and a second dielectric layer are sequentially formed on the semiconductor substrate on which the first and second metal wiring layers are formed. The first dielectric layer and the second dielectric layer have a hole region through which the top surface of the second metal wiring layer is exposed. An upper electrode of a capacitor is formed by forming a dielectric layer at sidewalls and a bottom of the hole region such that the hole region is completely filled with the upper electrode and a top surface of the upper electrode is level with a top surface of the second dielectric layer. A third dielectric layer and a fourth dielectric layer are sequentially formed on the semiconductor substrate on which the upper electrode is formed. A damascene structure is formed in the fourth, third, second, and first dielectric layers to contact the top surface of the first metal wiring layer, and a contact plug is formed in the fourth and third dielectric layers to contact the top surface of the upper electrode.

Forming the upper electrode of a capacitor may include forming a dielectric layer on the second dielectric layer and at the sidewalls and bottom of the hole region, forming a second metal layer to completely fill the hole region on the semiconductor substrate on which the dielectric layer is formed, and planarizing the semiconductor substrate on which the second metal layer is formed to expose the top surface of the second dielectric layer.

Preferably, the planarization is performed by chemical mechanical polishing (CMP). The second metal layer may be formed of one selected from the group consisting of a Ta layer, a TaN layer, a TaSiN layer, a TiN layer, a TiSiN layer, a WN layer, a WSiN layer, and any combination thereof. Alternatively, the second metal layer may be formed of one selected from the group consisting of a double layer including a Ta layer and a Cu layer, a double layer including a TaN layer and a Cu layer, and a triple layer including a Ta layer, a TaN layer, and a Cu layer.

To provide the above features, there is provided a method for manufacturing a semiconductor device having a MIM capacitor and a damascene wiring layer structure according to a second embodiment of the present invention, wherein a first metal wiring layer and a second metal wiring layer are formed in a lower dielectric layer on a semiconductor substrate such that top surfaces of the first and second metal wiring layers are level with a top surface of the lower dielectric layer. A first dielectric layer and a second dielectric layer are sequentially formed on the semiconductor substrate on which the first and second metal wiring layers are formed. The first dielectric layer and the second dielectric layer have a hole region through which the top surface of the second metal wiring layer is exposed. An upper electrode of a capacitor is formed by forming a dielectric layer at sidewalls and a bottom of the hole region such that the hole region is partially filled with the upper electrode and a top surface of the upper electrode is level with a top surface of the second dielectric layer. A third dielectric layer and a fourth dielectric layer are sequentially formed on the semiconductor substrate on which the upper electrode is formed. A damascene structure is formed in the fourth, third, second, and first dielectric layers to contact the top surface of the first metal wiring layer and a contact plug is formed in the fourth and third dielectric layers to contact the top surface of the upper electrode.

Forming the upper electrode of a capacitor may include forming a dielectric layer on the second dielectric layer and at the sidewalls and bottom of the hole region, forming a second metal layer to partially fill the hole region on the semiconductor substrate, on which the dielectric layer is formed, forming a capping layer on the semiconductor substrate, on which the second metal layer is formed, forming a second metal layer pattern and a capping layer pattern by planarizing the semiconductor substrate, on which the capping layer is formed, to expose the top surface of the second dielectric layer, and cleaning the semiconductor substrate, on which the capping layer pattern is formed. Forming the second metal layer pattern and the capping layer pattern is preferably performed by CMP. The second metal layer may be formed of one selected from the group consisting of a Ta layer, a TaN layer, a TaSiN layer, a TiN layer, a TiSiN layer, a WN layer, a WSiN layer, and any combination thereof. Alternatively, the second metal layer may be formed of one selected from the group consisting of a double layer including a Ta layer and a Cu layer, a double layer including a TaN layer and a Cu layer, and a triple layer including a Ta layer, a TaN layer, and a Cu layer. The capping layer may be formed of one selected from the group consisting of a TEOS layer, a PEOX layer, a SiOF layer, and a SiOC layer.

Preferably, in the methods for manufacturing a semiconductor device according to the first and second embodiments of the present invention, in order to form the first and second metal wiring layers, a first trench and a second trench are formed in the lower dielectric layer. A first metal layer is formed to completely fill the first and second trenches. A top surface of the first metal layer is planarized to expose the top surface of the lower dielectric layer. Here, the first metal layer is preferably formed of a Cu layer. A first barrier metal layer may be formed at sidewalls and bottoms of the first and second trenches before forming the first metal layer.

Preferably, in the methods for manufacturing a semiconductor device according to the first and second embodiments of the present invention, in order to form the damascene wiring layer structure and the contact plug, a via trench is formed in the fourth, third, second, and first dielectric layers to expose the top surface of the first metal wiring layer. A metal wiring layer region trench is formed in the fourth and third dielectric layers and over the via trench. A contact hole is formed in the fourth and third dielectric layers to expose the top surface of the upper electrode. A third metal layer is formed to completely fill the via trench, the metal wiring layer region trench, and the contact hole. A top surface of the third metal layer is planarized to expose a top surface of the fourth dielectric layer. The third metal layer is preferably formed of a Cu layer. A second barrier metal layer may be formed at sidewalls and bottoms of the via trench, the metal wiring layer region trench, and the contact hole before forming the third metal layer.

The methods for manufacturing a semiconductor device according to the first and second embodiments of the present invention may further include forming a lower electrode of a capacitor on the second metal wiring layer before forming the first and second dielectric layers. In this case, the first and second dielectric layers are formed to have a hole region through which the top surface of the lower electrode is exposed. The lower electrode of a capacitor may be formed of one selected from the group consisting of a Ta layer, a TaN layer, a TaSiN layer, a TiN layer, a TiSiN layer, a WN layer, a WSiN layer, and any combination thereof.

According to the present invention, during the formation of an upper electrode of a capacitor, damage to a dielectric layer may be prevented. In addition, there is no need to chemically and mechanically polish a dielectric layer used to form metal wiring layers after a capacitor is formed.

BRIEF DESCRIPTION OF THE DRAWINGS

The above and other features and advantages of the present invention will become readily apparent to those of ordinary skill in the art upon review of the detailed description of preferred embodiments that follows with reference to the attached drawings in which.

DETAILED DESCRIPTION OF THE INVENTION

Figure 1:
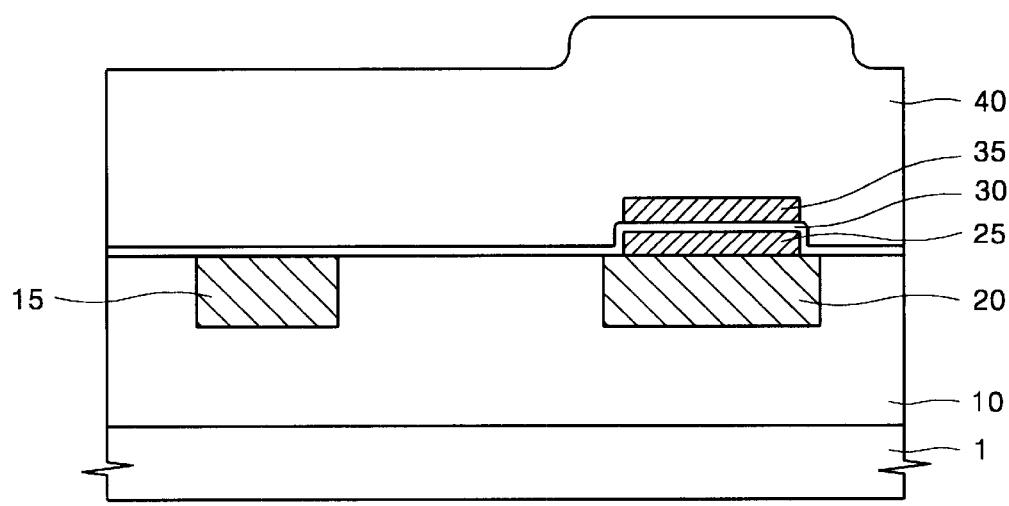
FIGS. 1 and 2 illustrate cross-sectional views of stages of a conventional method for manufacturing a semiconductor device having a MIM capacitor and a damascene wiring layer structure.
Figure 2:
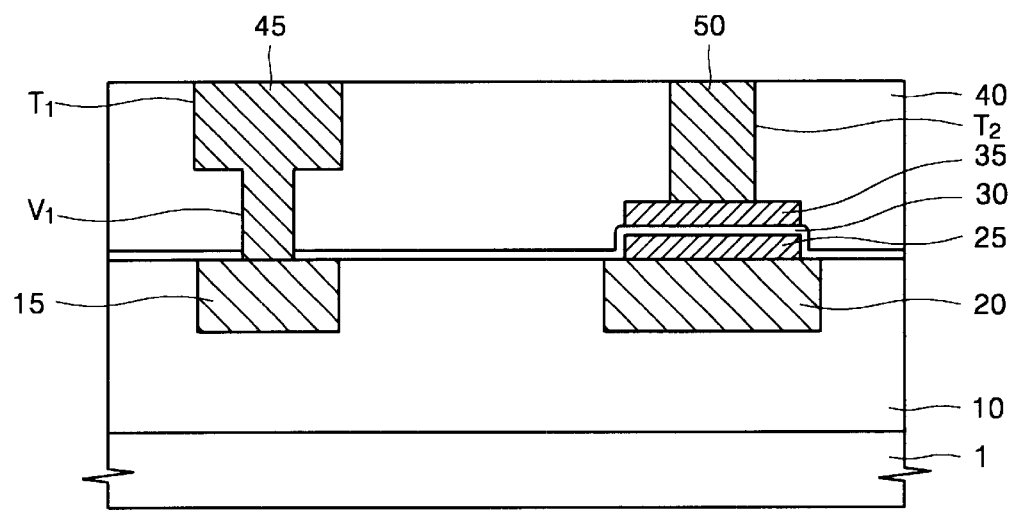

Korean Patent Application No. 2001-46517, filed on Aug. 1, 2001, and entitled: "Method for Manufacturing Semiconductor Device Having Metal-Insulator-Metal Capacitor and Damascene Wiring Layer Structure," is incorporated herein by reference in its entirety.

The present invention will now be described more fully with reference to the accompanying drawings, in which preferred embodiments of the invention are shown. The present invention may, however, be embodied in many different forms and should not be construed as being limited to the embodiments set forth herein. Rather, these embodiments are provided so that this disclosure will be thorough and complete, and will fully convey the concept of the invention to those of ordinary skill in the art. In the drawings, the thickness of layers and regions are exaggerated for clarity. It will also be understood that when a layer is referred to as being "on" another layer or substrate, it may be directly on the other layer or substrate, or intervening layers may also be present.

<First Embodiment>

Figure 3:
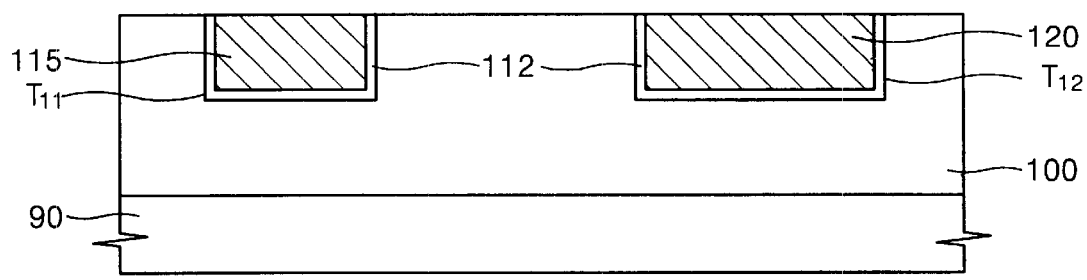
FIGS. 3 through 8 illustrate cross-sectional views of stages of a method for manufacturing a semiconductor device having a MIM capacitor and a damascene wiring layer structure according to a first embodiment of the present invention.

FIGS. 3 through 8 illustrate cross-sectional views of stages of a method for manufacturing a semiconductor device having a MIM capacitor and a damascene wiring layer structure according to a first embodiment of the present invention. Referring to FIG. 3, a lower dielectric layer 100 is formed on a semiconductor substrate 90. First and second trenches $T_{11}$ and $T_{12}$ are formed in the lower dielectric layer 100. A first barrier metal layer 112 is formed along surfaces of the first and second trenches $T_{11}$ and $T_{12}$. The first barrier metal layer 112 may be formed of a Ta layer, a TaN layer, a TaSiN layer, a TiN layer, a TiSiN layer, a WN layer, a WsiN layer, or any combination thereof. The first barrier metal layer 112 prevents metal atoms in a first metal layer, which will be formed to fill the first and second trenches $T_{11}$ and $T_{12}$ in a subsequent process, from diffusing into the lower dielectric layer 100. The first metal layer is preferably formed of a copper (Cu) layer. Specifically, copper seeds are formed at sidewalls and bottom of each of the first and second trenches $T_{11}$ and $T_{12}$, in which the first barrier metal layer 112 is formed. Next, a copper layer is formed by electroplating to completely fill the first and second trenches $T_{11}$ and $T_{12}$. Next, a top surface of the first metal layer is planarized by CMP to expose a top surface of the lower dielectric layer 100. Finally, a first metal wiring layer 115 and a second metal wiring layer 120 are formed such that a top surface of each is level with the top surface of the lower dielectric layer.

Figure 4:
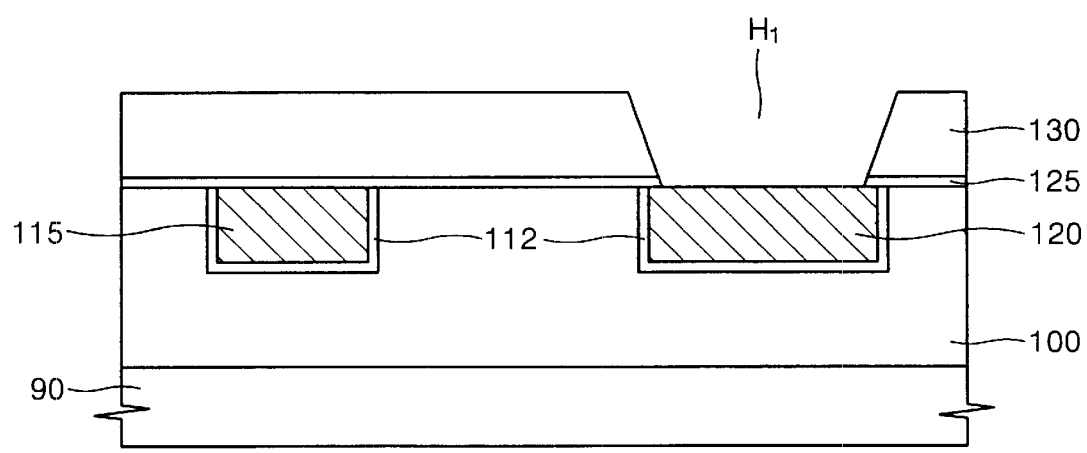

Referring to FIG. 4, a first dielectric layer 125 and a second dielectric layer 130 are sequentially formed to have a hole region $H_1$ on the semiconductor substrate 90, on which the first and second metal wiring layers 115 and 120 are formed. The top surface of the second metal wiring layer 120 is exposed through the hole region $H_1$. For example, a SiN layer or a SiC layer is formed as the first dielectric layer 125 on the semiconductor substrate 90, on which the first and second metal wiring layers 115 and 120 are formed. The first dielectric layer 125 prevents metal atoms in the first and second metal wiring layers 115 and 120 from diffusing into a second dielectric layer 130 on the first dielectric layer 125. Next, the second dielectric layer 130 is formed, preferably of a TEOS layer, a PEOX layer, a SiOF layer, or a SiOC layer, on the first dielectric layer 125. For example, the TEOS layer may be formed by chemical vapor deposition (CVD) using a TEOS source gas. The PEOX layer may be formed by plasma-CVD using $SiH_4$ gas and $N_2$ gas. The SiOF layer may be formed by high density plasma (HDP)-CVD using $SiH_4$ gas, $SiF_4$ gas, $O_2$ gas, and Ar gas. The SiOC layer may be formed by CVD using an organic source gas, such as trimethyl silane. Next, the first and second dielectric layers 125 and 130 are patterned to expose the top surface of the second metal wiring layer 120.

Figure 5:
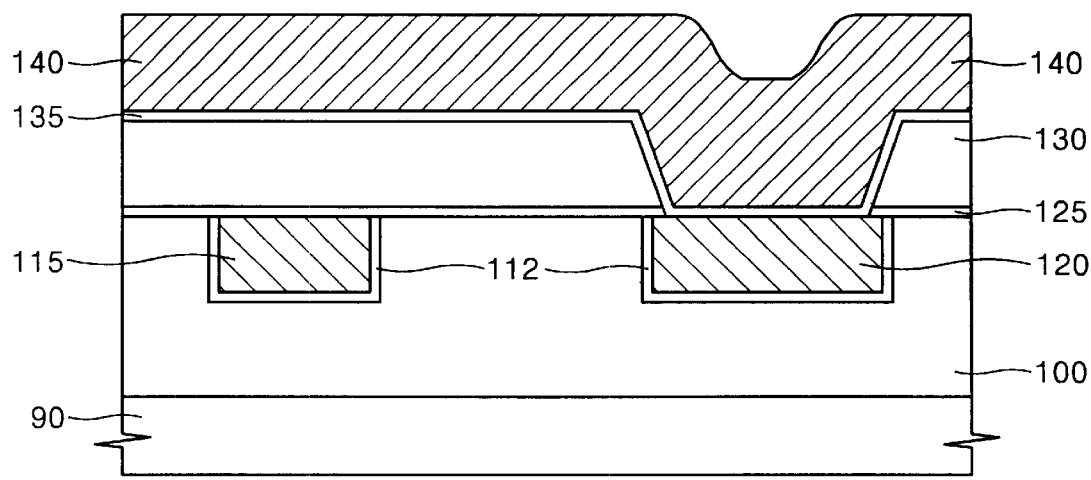

Referring to FIG. 5, an intermediate dielectric layer 135 is formed on the second dielectric layer 130 and at sidewalls and bottom of the hole region $H_1$. The intermediate dielectric layer 135 may be formed of a SiN layer or a SiC layer. Here, the SiN layer or the SiC layer may be formed as a single layer or may be combined with an oxide layer to form a double layer. For example, the intermediate dielectric layer 135 may be formed of a double layer including a SiN layer and a SiOC layer, a double layer including a SiN layer and a TEOS layer, a double layer including a SiN layer and a PEOX layer, a double layer including a SiC layer and a SiOC layer, a double layer including a SiC layer and a TEOS layer, or a double layer including a SiC layer and a PEOX layer. If the intermediate dielectric layer 135 is formed of a double layer including a SiN layer and an oxide layer or a double layer including a SiC layer and an oxide layer, the leakage current of a capacitor may be reduced.

Thickness of the intermediate dielectric layer 135 is adjusted in accordance with a capacitance of a capacitor. A second metal layer 140 is formed on the semiconductor substrate 90 on which the intermediate dielectric layer 135 is formed such that the hole region $H_1$ is completely filled with the second metal layer 140. The second metal layer 140 may be formed of a Ta layer, a TaN layer, a TaSiN layer, a TiN layer, a TiSiN layer, a WN layer, a WsiN layer, or any combination thereof. Alternatively, the second metal layer 140 may be formed of a double layer including a Ta layer and a Cu layer, a double layer including a TaN layer and a Cu layer, or a triple layer including a Ta layer, a TaN layer, and a Cu layer.

Figure 6:
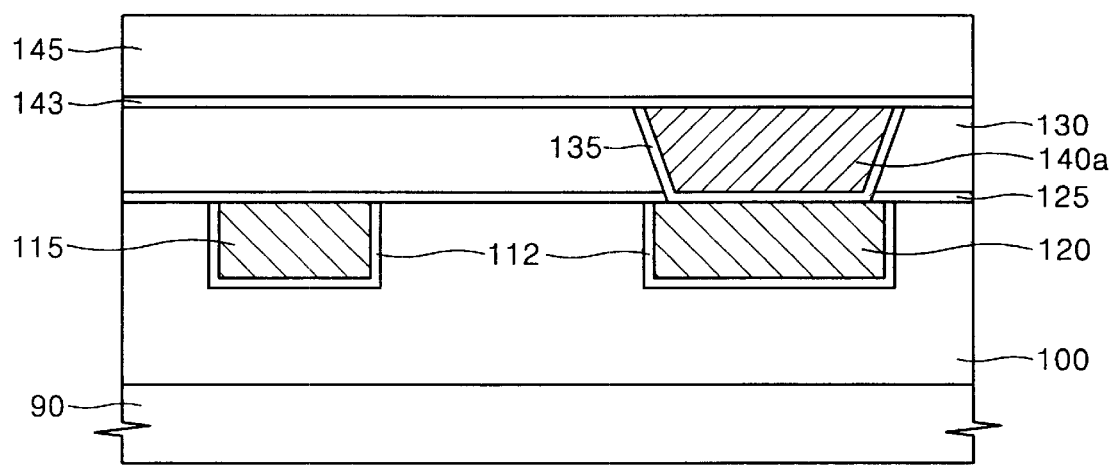

Referring to FIG. 6, the semiconductor substrate 90 on which the second metal layer 140 is formed is planarized, preferably by CMP, to expose the top surface of the second dielectric layer 130. Then, an upper electrode 140a of a capacitor is formed to completely fill the hole region $H_1$ so that a top surface thereof is level with the top surface of the second dielectric layer 130. In the planarization of the semiconductor substrate 90 on which the second metal layer 140 is formed, the intermediate dielectric layer 135 formed on the second dielectric layer 130 is completely removed while leaving a portion of the intermediate dielectric layer 135 at the sidewalls and bottom of the hole region $H_1$. Thus the second metal layer 140, as shown in FIG. 6, remains only in the upper electrode 140a of a capacitor (i.e., remains only in the hole region $H_1$).

In the prior art, an upper electrode is formed by photolithography, and thus a dielectric layer under the upper electrode may be damaged by plasma during patterning the upper electrode. However, according to this embodiment of the present invention, the upper electrode 140a is formed by CMP, thus solving the above-mentioned problem with the prior art.

Next, a third dielectric layer 143 and a fourth dielectric layer 145 are sequentially formed on the semiconductor substrate 90 on which the upper electrode 140a is formed. The third dielectric layer 143 is preferably formed of a SiN layer and a SiC layer. The fourth dielectric layer 145, like the second dielectric layer 130, is preferably formed of a TEOS layer, a PEOX layer, a SiOF layer, and a SiOC layer. In this embodiment of the present invention, unlike in the prior art, the upper electrode 140a is formed having no step difference with the top surface of the second dielectric layer 130, and thus there is no need for additional planarization of the fourth dielectric layer 145.

Figure 7:
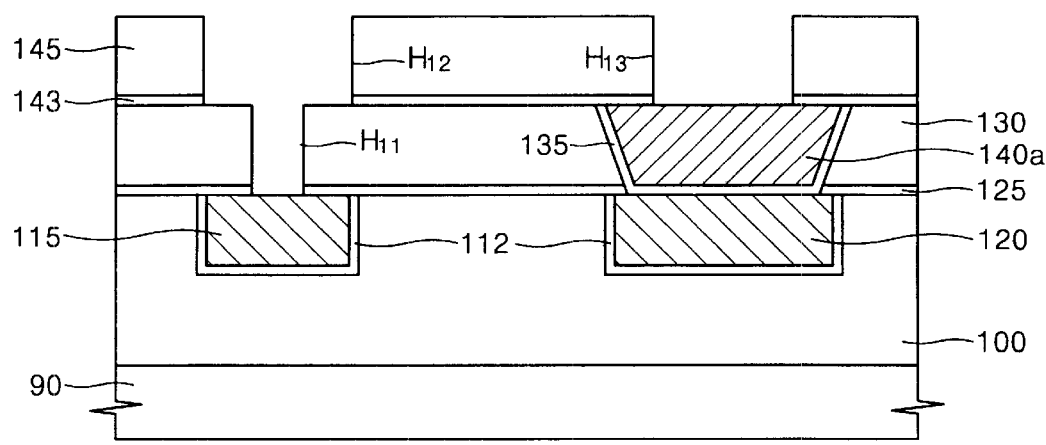

Referring to FIG. 7, a via trench $H_{11}$ is formed in the fourth dielectric layer 145, the third dielectric layer 143, the second dielectric layer 130, and the first dielectric layer 125 to expose the top surface of the first metal wiring layer 115. Next, a metal wiring layer region trench $H_{12}$ is formed in the fourth dielectric layer 145 and the third dielectric layer 143 and over the via trench $H_{11}$. In order to form the metal wiring layer region trench $H_{12}$, the fourth dielectric layer 145 is etched by an etching process in which the etching selection ratio of the fourth dielectric layer 145 with respect to that of the third dielectric layer 143 is high. At the time of etching the fourth dielectric layer 145, the third dielectric layer 143 acts as an etching stopper. Next, the third dielectric layer 143 is etched, thereby completing the metal wiring layer region trench $H_{12}$. As mentioned above, the third dielectric layer 143 is introduced to act as an etching stopper when forming a dual damascene wiring layer structure.

During the formation of the metal wiring layer region trench $H_{12}$, a contact hole $H_{13}$ is formed in the fourth and third dielectric layers 145 and 143 to expose the top surface of the upper electrode 140a. In the present embodiment, the via trench $H_{11}$ is formed and then the metal wiring layer region trench $H_{12}$ is formed. However, the via trench H may be formed after forming the metal wiring layer region trench $H_{12}$ is formed.

Figure 8:
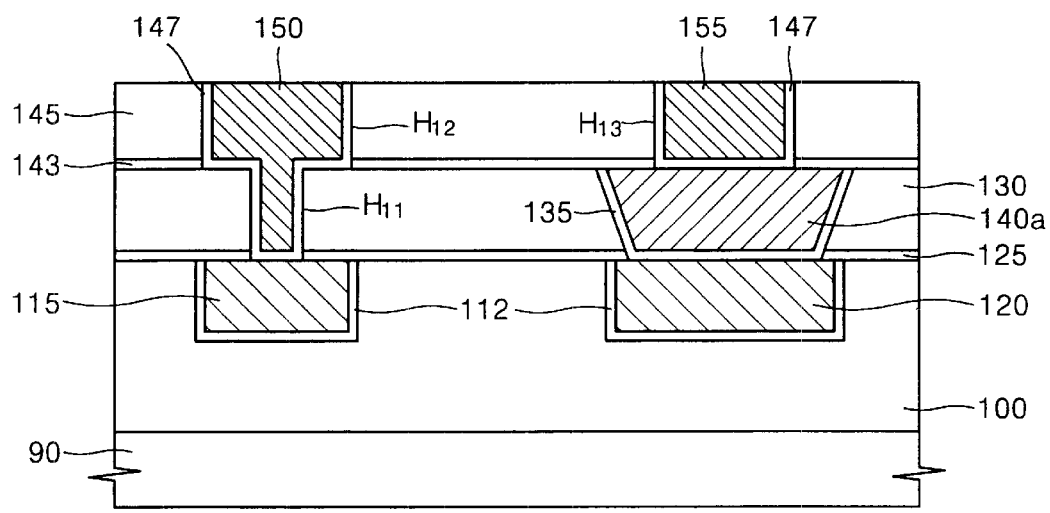

Referring to FIG. 8, a second barrier metal layer 147 is formed at sidewalls and bottoms of the via trench $H_{11}$, the metal wiring layer region trench $H_{12}$, and the contact hole $H_{13}$. The second barrier metal layer 147 may be formed of a Ta layer, a TaN layer, a TaSiN layer, a TiN layer, a TiSiN layer, a WN layer, a WsiN layer, or any combination thereof. The second barrier metal layer 147 prevents metal atoms in a third metal layer, which will be formed to fill the via trench $H_{11}$, the metal wiring layer region trench $H_{12}$, and the contact hole $H_{13}$ in a subsequent process, from diffusing into the fourth and second dielectric layers 145 and 130.

Next, the third metal layer is formed to completely fill the via trench $H_{11}$, the metal wiring layer region trench $H_{12}$, and the contact hole $H_{13}$. Here, the third metal layer is preferably formed of a Cu layer. The Cu layer is formed by forming Cu seeds at the sidewalls and bottoms of the via trench $H_{11}$, the metal wiring layer region trench $H_{12}$, and the contact hole $H_{13}$ and then performing an electroplating process on the Cu seeds. Next, the top surface of the third metal layer is planarized by CMP to expose the top surface of the fourth dielectric layer 145. As a result of planarization, a damascene wiring layer structure 150 is formed in the fourth, third, second, and first dielectric layers 145, 143, 130, and 125 to directly contact the top surface of the first metal wiring layer 115 and a contact plug 155 is formed in the fourth and third dielectric layers 145 and 143 to directly contact the top surface of the upper electrode 140a.

<Second Embodiment>

Figure 9:
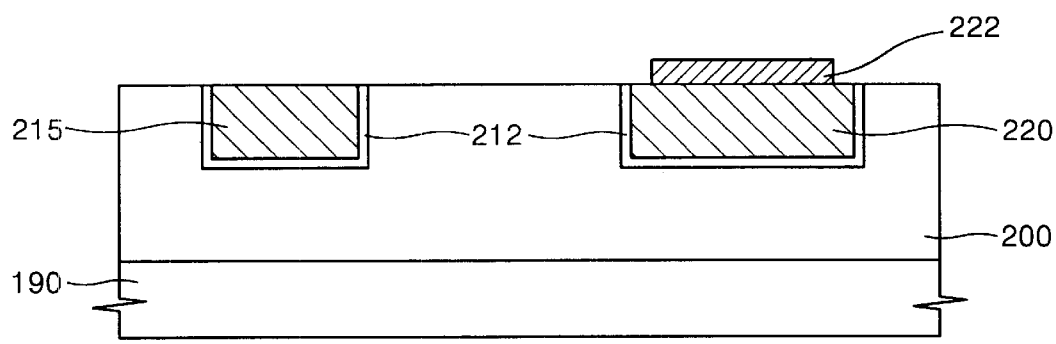
FIGS. 9 through 11 illustrate cross-sectional views of stages of a method for manufacturing a semiconductor device having a MIM capacitor and a damascene wiring layer structure according to a second embodiment of the present invention.
Figure 10:
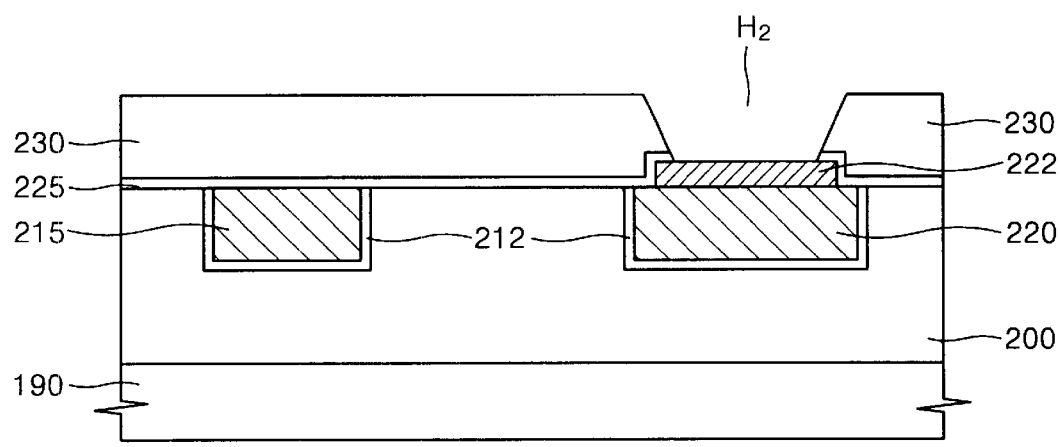
Figure 11:
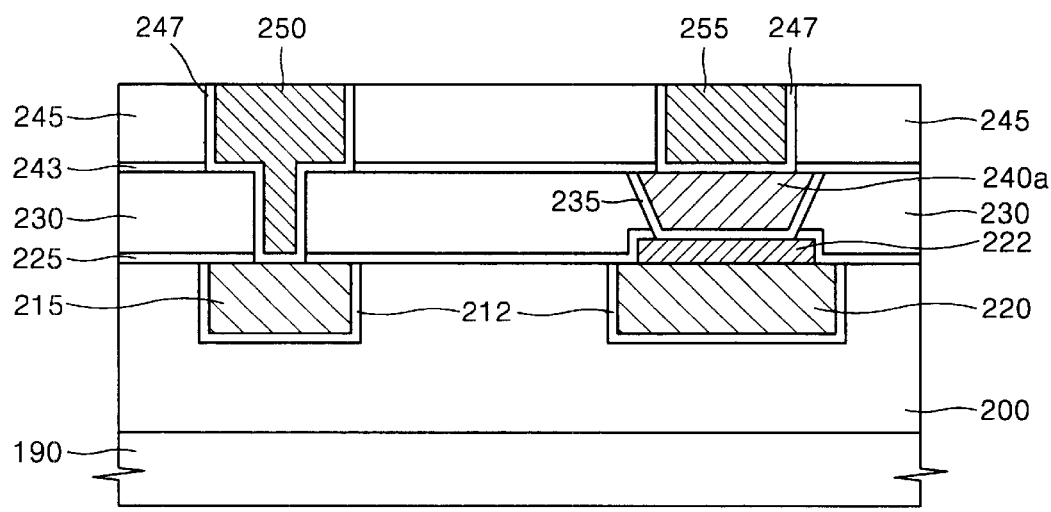

FIGS. 9 through 11 illustrate cross-sectional views of stages of a method for manufacturing a semiconductor device having a MIM capacitor and a damascene wiring layer structure according to a second embodiment of the present invention. Referring to FIG. 9, a first metal wiring layer 215 and a second metal wiring layer 220 are formed in a lower dielectric layer 200 on a semiconductor substrate 190 such that top surfaces of the first and second metal wiring layers 215 and 220 are level with a top surface of the lower dielectric layer 200. Reference numeral 212 indicates a first barrier metal layer. Next, a lower electrode 222 of a capacitor is formed to contact the top surface of the second metal wiring layer 220. For example, in order to form the lower electrode 222, a Ta layer, a TaN layer, a TaSiN layer, a TiN layer, a TiSiN layer, a WN layer, a WSiN layer, or any combination thereof is formed on the semiconductor substrate 190, on which the first and second metal wiring layers 215 and 220 are formed, and then is patterned.

Referring to FIG. 10, a first dielectric layer 225 and a second dielectric layer 230 are sequentially formed to have a hole region $H_2$, through which a top surface of the lower electrode 222 is exposed. For example, a SiN layer or a SiC layer is formed as the first dielectric layer 225 on the semiconductor substrate 190 on which the lower electrode 222 is formed. Next, a TEOS layer, a PEOX layer, a SiOF layer, or a SiOC layer is formed on the first dielectric layer 225 as the second dielectric layer 230. Next, the first and second dielectric layers 225 and 230 are patterned to expose the top surface of the lower electrode 222.

Subsequent processes are the same as those in the first embodiment. In other words, referring to FIG. 11, an intermediate dielectric layer 235 is formed on the second dielectric layer 230 and at sidewalls and bottom of the hole region $H_2$. A second metal layer is formed on the semiconductor substrate 190, on which the intermediate dielectric layer 235 is formed, so that the hole region $H_2$ is completely filled with the second metal layer. Next, the semiconductor substrate 190, on which the second metal layer is formed, is planarized to expose a top surface of the second dielectric layer 230. Then, an upper electrode 240a of a capacitor is formed to completely fill the hole region $H_2$ and to be level with the top surface of the second dielectric layer 230.

In the prior art, an upper electrode is formed by photolithography, and thus a dielectric layer under the upper electrode may be damaged by plasma during patterning the upper electrode. However, according to this embodiment of the present invention, the upper electrode 240a is formed by CMP, thus solving the above-mentioned problem with the prior art.

Next, a third dielectric layer 243 and a fourth dielectric layer 245 are sequentially formed on the semiconductor layer 190 on which the upper electrode 240a is formed. Unlike in the prior art, the upper electrode 240a is formed having no step difference with the top surface of the second dielectric layer 230, and thus there is no need to additionally planarize the fourth dielectric layer 245.

A damascene wiring layer structure 250 is formed in the fourth, third, second, and first dielectric layers 245, 243, 230, and 225 to contact the top surface of the first metal wiring layer 215, and a contact plug 255 is formed in the fourth and third dielectric layers 245 and 243 to contact the top surface of the upper electrode 240a. Reference numeral 247 indicates a second barrier metal layer.

In the first embodiment of the present invention, illustrated in FIGS. 3–8, since the second metal wiring layer 120 acts as a lower electrode of a MIM capacitor, there is no need to additionally form a lower electrode. However, when patterning the first and second dielectric layers 125 and 130, the top surface of the second metal wiring layer 120 may be damaged. Accordingly, the surface of the second metal wiring layer 120 may become rough, impurities may infiltrate into the second metal wiring layer 120, or the second metal wiring layer 120 may become concaved. As a result, the performance of the MIM capacitor may be deteriorated.

However, in the second embodiment of the present invention, the lower electrode 222 is formed, and thus a potential problem with the first embodiment may be obviated. The lower electrode 222 may be formed of a Ta layer, a TaN layer, a TaSiN layer, a TiN layer, a TiSiN layer, a WN layer, a WsiN layer, or any combination thereof. Due to the lower electrode 222, damage to the top surface of the second metal wiring layer 220 may be prevented when patterning the first and second dielectric layers 225 and 230.

<Third Embodiment>

Figure 12:
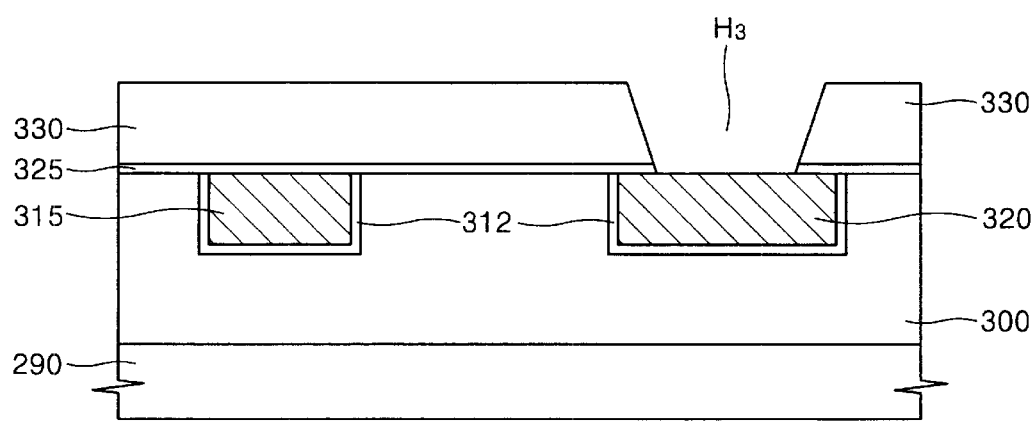
FIGS. 12 through 19 illustrate cross-sectional views of stages of a method for manufacturing a semiconductor device having a MIM capacitor and a damascene wiring layer structure according to a third embodiment of the present invention.

FIGS. 12 through 19 illustrate cross-sectional views of stages of a method for manufacturing a semiconductor device having a MIM capacitor and a damascene wiring layer structure according to a third embodiment of the present invention. Referring to FIG. 12, a first metal wiring layer 315 and a second metal wiring layer 320 are formed in a lower dielectric layer 300 on a semiconductor substrate 290 such that top surfaces of the first and second metal wiring layers 315 and 320 are level with a top surface of the lower dielectric layer 300. Reference numeral 312 indicates a first barrier metal layer. A first dielectric layer 325 and a second dielectric layer 330 are sequentially formed to have a hole region $H_3$ on the semiconductor substrate 290 on which the first and second metal wiring layers 315 and 320 are formed.

Figure 13:
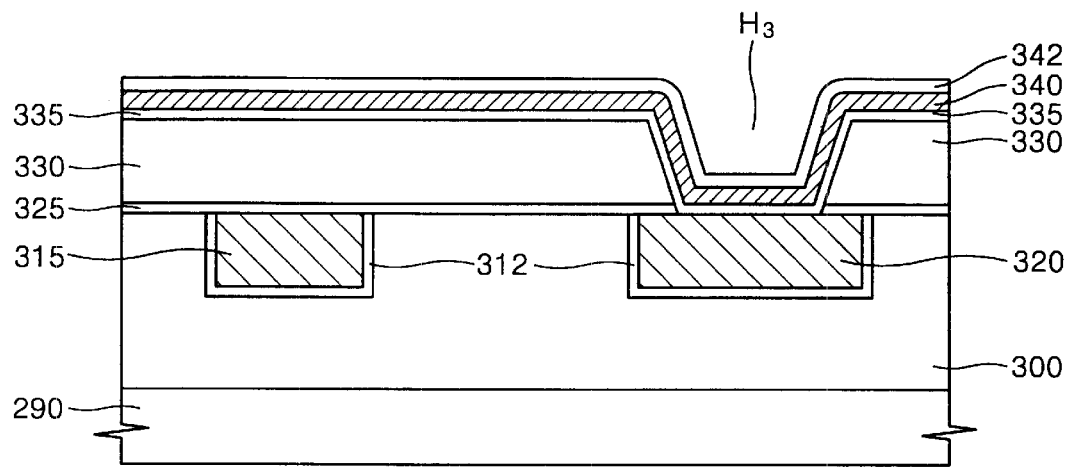

Referring to FIG. 13, an intermediate dielectric layer 335 is formed on the second dielectric layer 330 and at sidewalls and bottom of the hole region $H_3$. A second metal layer 340 is formed to partially fill the hole region $H_3$ on the semiconductor substrate 290 on which the intermediate dielectric layer 335 is formed. The second metal layer 340 may be formed of a Ta layer, a TaN layer, a TaSiN layer, a TiN layer, a TiSiN layer, a WN layer, a WsiN layer, or any combination thereof. Alternatively, the second metal layer 340 may be formed of a double layer including a Ta layer and a Cu layer, a double layer including a TaN layer and a Cu layer, or a triple layer including a Ta layer, a TaN layer, and a Cu layer.

In the third embodiment of the present invention, unlike in the first and second embodiments of the present invention, the second metal layer 340 is formed to be thin in order to reduce the amount of CMP necessary to be performed on the second metal layer 340. However, since the hole region $H_3$ is not completely filled with the second metal layer 340, slurry may remain in the hole region $H_3$ after chemically and mechanically polishing the second metal layer 340. In order to remove the slurry remaining in the hole region $H_3$, a cleaning process is necessary, wherein the second metal layer 340, which will be an upper electrode, may be damaged.

Therefore, in the third embodiment of the present invention, a capping layer 342 is formed to protect the second metal layer 340. The capping layer 342, like the second dielectric layer 330, may be formed of a TEOS layer, a PEOX layer, a SiOF layer, or a SiOC layer. The capping layer 342 may be formed to completely fill the hole region $H_3$ or may be formed to partially fill the hole region $H_3$, as shown in FIG. 13.

Figure 14:
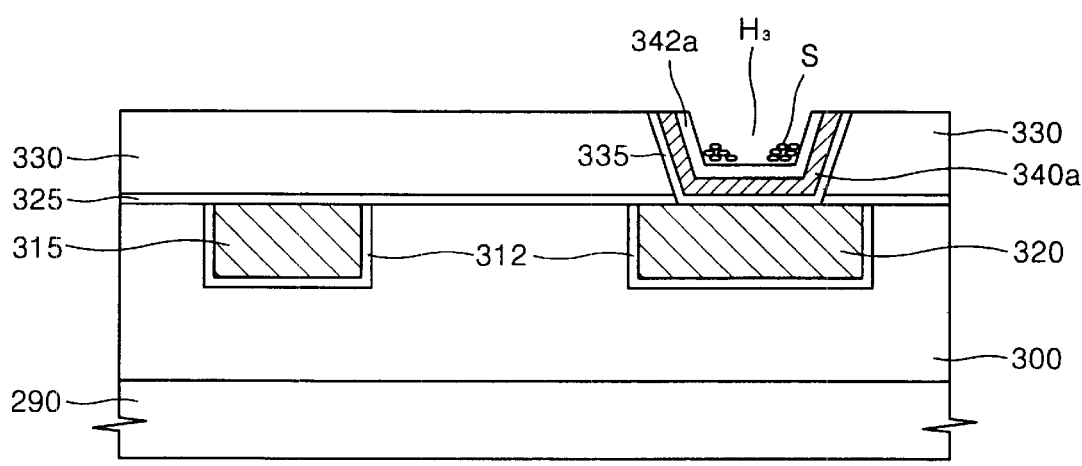

Referring to FIG. 14, the semiconductor substrate 290 on which the capping layer 342 is formed is planarized to expose a top surface of the second dielectric layer 330. As a result of planarization, an upper electrode 340a of a capacitor and a capping layer pattern 342a are formed at the sidewalls and bottom of the hole region $H_3$, on which the intermediate dielectric layer 335 is formed, such that the hole region $H_3$ is partially filled with the upper electrode 340a and the capping layer pattern 342a. Here, the step of forming the upper electrode 340a and the capping layer pattern 342a is preferably performed by CMP. As shown in FIG. 14, in a case where the capping layer pattern 342a partially fills the hole region $H_3$, slurry S may remain in the hole region $H_3$, as described above.

Figure 15:
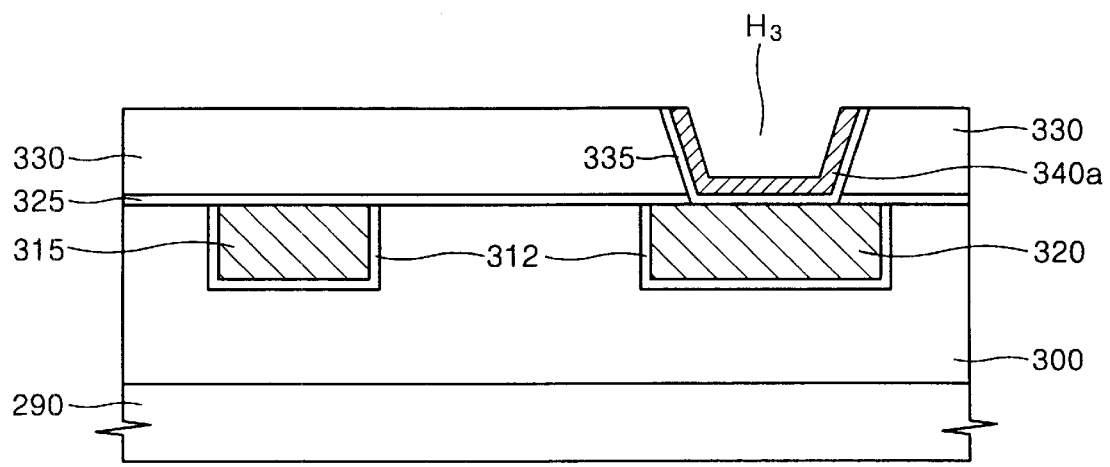

Referring to FIG. 15, the semiconductor substrate 290, on which the capping layer pattern (342a of FIG. 14) is formed, is cleaned. Cleaning the semiconductor substrate 290, on which the capping layer pattern 342a is formed, is typically performed by wet etching. During removal of the slurry S remaining in the hole region $H_3$, the capping layer pattern 342a is partially etched; however, the capping layer pattern 342a serves to protect the upper electrode 340a from an etching solution, which may infiltrate into the upper electrode 340a. Accordingly, damage to the upper electrode 340a by the etching solution may be prevented.

Figure 16:
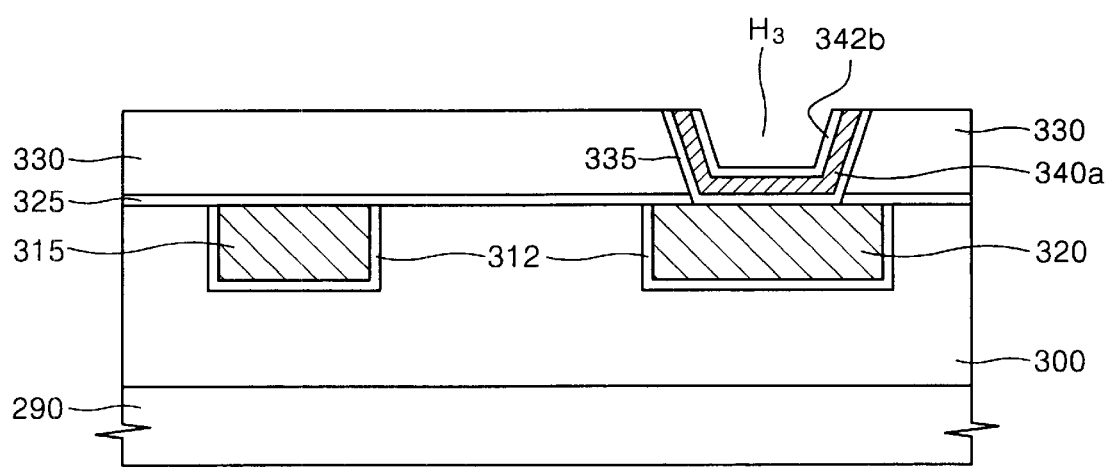

Since the capping layer pattern 342a and the second dielectric layer 330 are oxide layers of the same kind, the second dielectric layer pattern 330 is etched along with the capping layer pattern 342a during cleaning of the semiconductor substrate 290. In order to prevent the second dielectric layer pattern 330 from being excessively etched, the time for which the second dielectric layer pattern 330 is etched may be controlled. If so, the capping layer pattern 342a is partially removed, and thus, as shown in FIG. 16, a capping layer pattern 342b with a reduced thickness remains on the resulting semiconductor substrate 290.

In the prior art, an upper electrode is formed by photolithography, and thus a dielectric layer under the upper electrode may be damaged by plasma during patterning the upper electrode. However, according to this embodiment of the present invention, the upper electrode 340a is formed by CMP, and thus the above-mentioned problem with the prior art may be solved. Even if a cleaning process for removing slurry, which is used in CMP and may remain in the hole region $H_3$, is performed, the capping layer pattern (342a of FIG. 14) protects the upper electrode 340a from an etching solution used in the cleaning process, and thus damage to the upper electrode 340a may be prevented.

Figure 17:
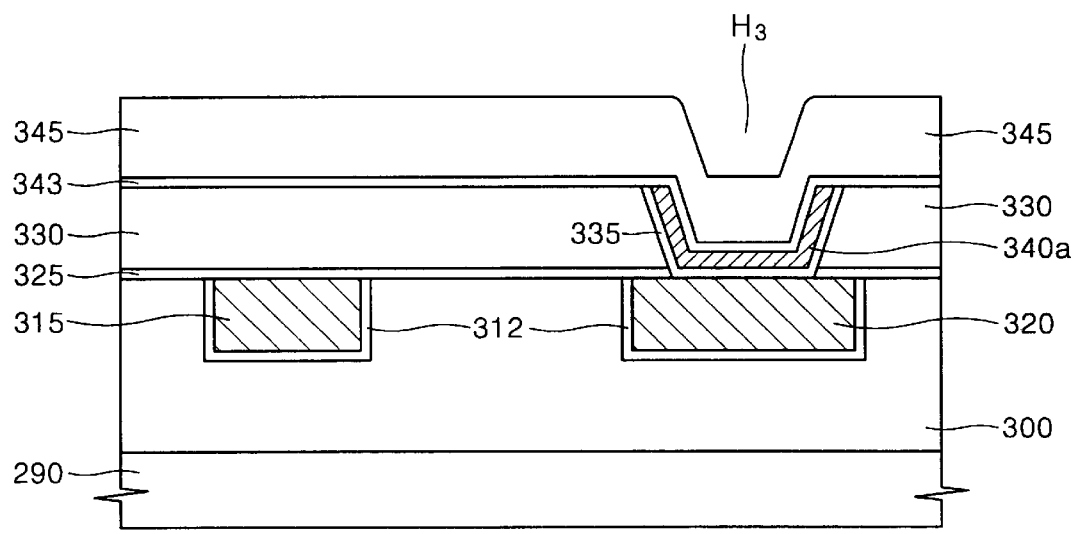

Referring to FIG. 17, a third dielectric layer 343 and a fourth dielectric layer 345 are sequentially formed on the semiconductor substrate 290 on which the upper electrode 340a is formed. The fourth dielectric layer 345, like the second dielectric layer 330 and the capping layer (342 of FIG. 13), may be formed of a TEOS layer, a PEOX layer, a SiOF layer, or a SiOC layer. In this embodiment of the present invention, unlike in the prior art, the fourth dielectric layer 345 is not planarized.

Figure 18:
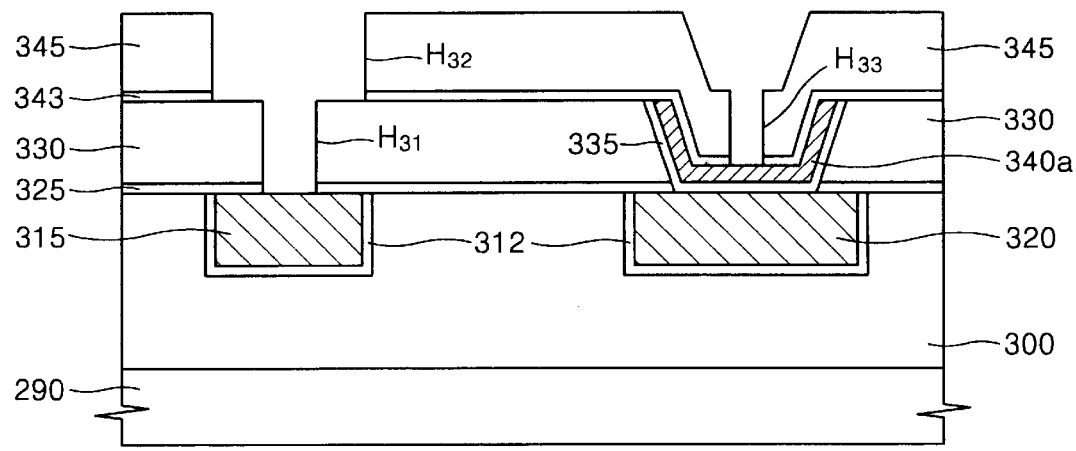

Referring to FIG. 18, a via trench $H_{31}$ is formed in the fourth, third, second, and first dielectric layers 345, 343, 330, and 325 to expose the top surface of the first metal wiring layer 315. A metal wiring layer region trench $H_{32}$ is formed in the fourth and third dielectric layers 345 and 343 and over the via trench $H_{31}$. During the formation of the metal wiring layer region trench $H_{32}$, a contact hole $H_{33}$ is formed in the fourth and third dielectric layers 345 and 343 to expose a top surface of the upper electrode 340a. In a case where the capping layer pattern (342b of FIG. 16) with a reduced thickness remains on the semiconductor substrate 290 which has already been subjected to the cleaning process, it is quite clear to those skilled in the art that the contact hole $H_{33}$ is also formed in the capping layer pattern (342a of FIG. 14). In this embodiment of the present invention, the metal wiring layer region trench $H_{32}$ is formed after forming the via trench $H_{31}$; however, the via trench $H_{31}$ may be formed before forming the metal wiring layer region trench $H_{32}$.

Figure 19:
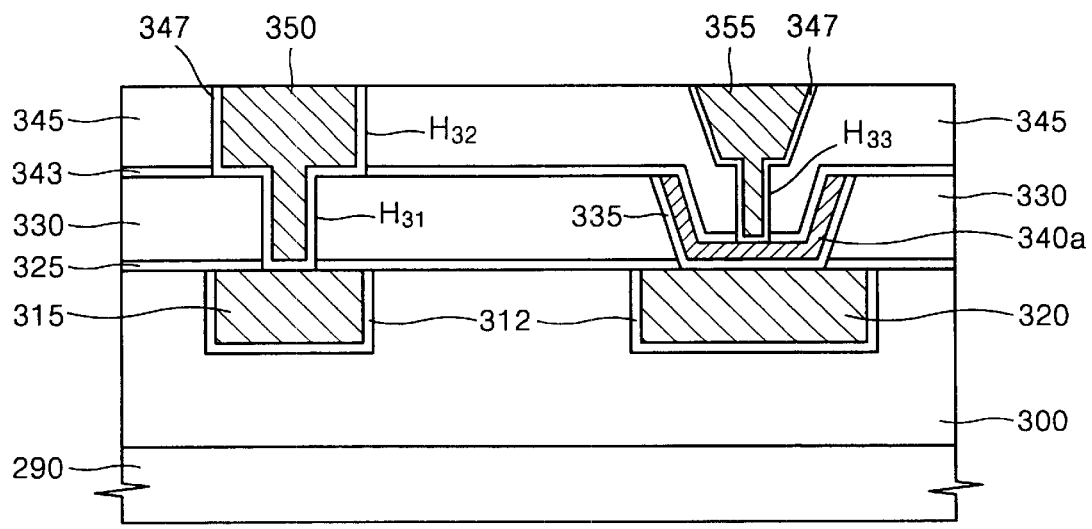

Referring to FIG. 19, a second barrier metal layer 347 is formed at sidewalls and bottoms of the via trench $H_{31}$, the metal wiring layer region trench $H_{32}$, and the contact hole $H_{33}$. The second barrier metal layer 347 may be formed of a Ta layer, a TaN layer, a TaSiN layer, a TiN layer, a TiSiN layer, a WN layer, a WsiN layer, or any combination thereof. Next, a third metal layer is formed to completely fill the via trench $H_{31}$, the metal wiring layer region trench $H_{32}$, and the contact hole $H_{33}$. Here, the third metal layer is preferably formed of a Cu layer. The Cu layer may be formed by forming Cu seeds at the sidewalls and bottoms of the via trench $H_{31}$, the metal wiring layer region trench $H_{32}$, and the contact hole $H_{33}$ and performing an electroplating process on the Cu seeds. The top surface of the third metal layer is planarized to expose the top surface of the fourth dielectric layer 345 by CMP. As a result of planarization, a damascene wiring layer structure 350 is formed in the fourth, third, second, and first dielectric layers 345, 343, 330, and 325 to directly contact the top surface of the first metal wiring layer 315, and a contact plug 355 is formed in the fourth and third dielectric layers 345 and 343 to directly contact the top surface of the upper electrode 340a.

<Fourth Embodiment>

Figure 20:
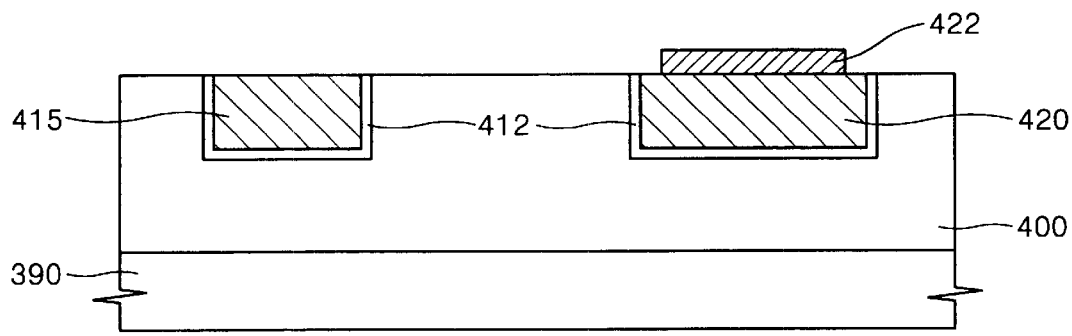
FIGS. 20 through 22 illustrate cross-sectional views of stages of a method for manufacturing a semiconductor device having a MIM capacitor and a damascene wiring layer structure according to a fourth embodiment of the present invention.
Figure 21:
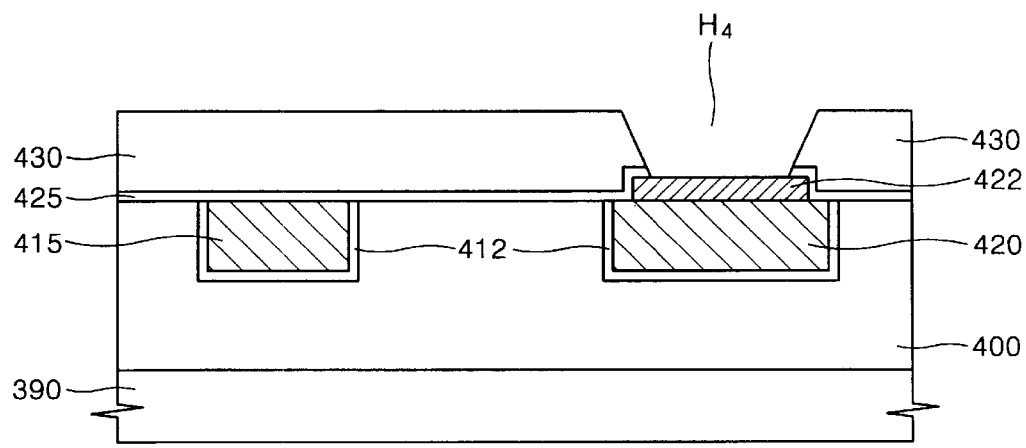
Figure 22:
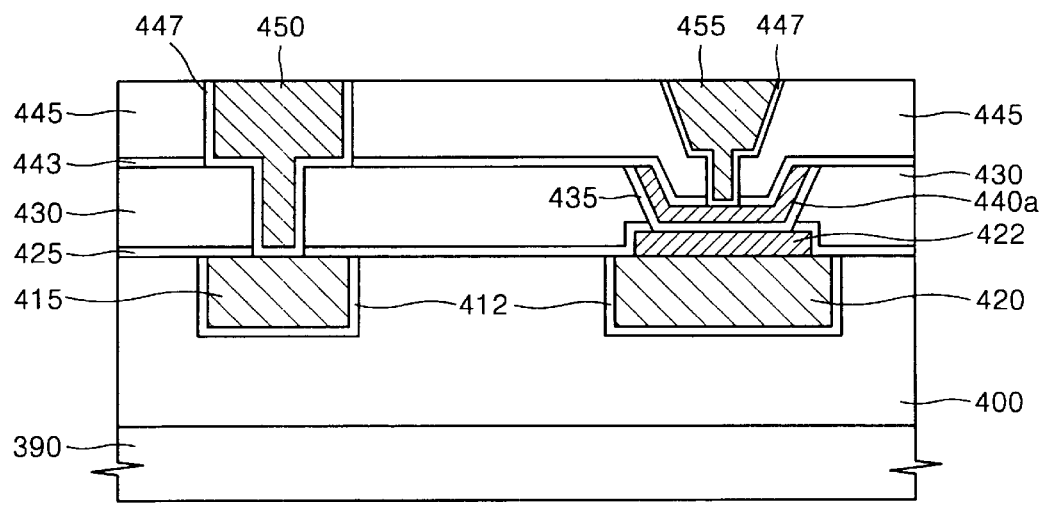

FIGS. 20 through 22 illustrate cross-sectional views of stages of a method for manufacturing a semiconductor device having a MIM capacitor and a damascene wiring layer structure according to a fourth embodiment of the present invention. Referring to FIG. 20, a first metal wiring layer 415 and a second metal wiring layer 420 are formed in a lower dielectric layer 400 on a semiconductor substrate 390 such that top surfaces of the first and second metal wiring layers 415 and 420 are level with a top surface of the lower dielectric layer 400. Reference numeral 412 indicates a first barrier metal layer. A lower electrode 422 of a capacitor is formed to contact the top surface of the second metal wiring layer 420. For example, a Ta layer, a TaN layer, a TaSiN layer, a TiN layer, a TiSiN layer, a WN layer, a WsiN layer, or any combination thereof is formed on the semiconductor substrate 390, on which the first and second metal wiring layers 415 and 420 are formed, and is patterned.

Referring to FIG. 21, a first dielectric layer 425 and a second dielectric layer 430 are sequentially formed to have a hole region $H_4$, through which the top surface of the lower electrode 422 is exposed. For example, a SiN layer or a SiC layer is formed as the first dielectric layer 425 on the semiconductor substrate 390, on which the lower electrode 422 is formed. Next, a TEOS layer, a PEOX layer, a SiOF layer, or a SiOC layer is formed as the second dielectric layer 430 on the first dielectric layer 425. The first and second dielectric layers 425 and 430 are patterned to expose the top surface of the lower electrode 422.

Subsequent processes are the same as those in the third embodiment. In other words, referring to FIG. 22, an intermediate dielectric layer 435 is formed on a top surface of the second dielectric layer 430 and at sidewalls and bottom of the hole region ($H_4$ of FIG. 21). A second metal layer is formed on the semiconductor substrate 390, on which the intermediate dielectric layer 435 is formed, such that the hole region $H_4$ is partially filled with the second metal layer. In order to protect the second metal layer, a capping layer is formed. The semiconductor substrate 390, on which the capping layer is formed, is planarized to expose the top surface of the second dielectric layer 430. As a result of planarization, an upper electrode 440a of a capacitor and a capping layer pattern are formed at the sidewalls and bottom of the hole region $H_4$, in which the intermediate dielectric layer 435 is formed, such that the hole region $H_4$ is partially filled with the upper electrode 440a and the capping layer pattern. Next, a cleaning process is performed to remove slurry used in CMP, which may remain in the hole region $H_4$. The capping layer pattern may also remain in the hole region $H_4$ after the cleaning process. The capping layer pattern protects the upper electrode 440a from an etching solution.

In the prior art, an upper electrode is formed by photolithography, and thus a dielectric layer under the upper electrode may be damaged by plasma during patterning the upper electrode. However, according to this embodiment of the present invention, the upper electrode 440a is formed by CMP, and thus the above-mentioned problem with the prior art may be solved.

Next, a third dielectric layer 443 and a fourth dielectric layer 445 are sequentially formed on the semiconductor substrate 390 on which the upper electrode 440a is formed. Unlike in the prior art, planarization is not additionally performed on the fourth dielectric layer 445. Next, a damascene wiring layer structure 450 is formed in the fourth, third, second, and first dielectric layers 445, 443, 430, and 425 to directly contact the top surface of the first metal wiring layer 415 and a contact plug 455 is formed in the fourth and third dielectric layers 445 and 443 to directly contact the top surface of the upper electrode 440a. Reference numeral 447 represent a second barrier metal layer.

In the third embodiment of the present invention, shown in FIGS. 12–19, the second metal wiring layer 320 acts as a lower electrode of a MIM capacitor, and thus a lower electrode is not formed. However, during patterning of the first and second dielectric layers 325 and 330, the top surface of the second metal wiring layer 320 may be damaged. Accordingly, the surface of the second metal wiring layer 320 may become rough, impurities may infiltrate into the second metal wiring layer 320, or the second metal wiring layer 320 may become concaved. As a result, the performance of the MIM capacitor may deteriorate. However, in the fourth embodiment of the present invention, the lower electrode 422 is formed, and thus a potential problem with the first embodiment may be obviated.

According to the present invention, during the formation of an upper electrode of a capacitor, damage to a dielectric layer may be prevented. Thus, damage to the surface of the dielectric layer by an etching process may also be prevented, and deterioration of the performance of the capacitor may therefore be additionally prevented.

In addition, there is no need to chemically and mechanically polish a dielectric layer used to form metal wiring layers after a capacitor is formed. Thus, the overall manufacturing process of a semiconductor device may be simplified.

Finally, according to the present invention, it is possible to provide a copper wiring layer structure, which has a resistivity lower than an aluminium wiring layer structure and has superior electromigration resistance, by forming a damascene wiring layer structure. Thus, it is possible to maintain the operational speed and reliability of a semiconductor device, irrespective of the decrease in the area of wiring layers.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing a semiconductor device having a metal-insulator-metal (MIM) capacitor and a damascene wiring layer structure, comprising:

forming a first metal wiring layer and a second metal wiring layer in a lower dielectric layer on a semiconductor substrate such that top surfaces of the first and second metal wiring layers are level with a top surface of the lower dielectric layer;

sequentially forming a first dielectric layer and a second dielectric layer on the semiconductor substrate on which the first and second metal wiring layers are formed, such that the first dielectric layer and the second dielectric layer have a hole region with outwardly sloping sidewalls through which the top surface of the second metal wiring layer is exposed;

forming an upper electrode of a capacitor after forming an intermediate dielectric layer at sidewalls and a bottom of the hole region such that the hole region is completely filled with the upper electrode and a top surface of the upper electrode is level with a top surface of the second dielectric layer;

sequentially forming a third dielectric layer and a fourth dielectric layer on the semiconductor substrate on which the upper electrode is formed; and forming a damascene structure in the fourth, third, second, and first dielectric layers to contact the top surface of the first metal wiring layer and forming a contact plug in the fourth and third dielectric layers to contact the top surface of the upper electrode.

2. The method as claimed in claim 1, wherein forming the first and second metal wiring layers comprises:

forming a first trench and a second trench in the lower dielectric layer;

forming a first metal layer to completely fill the first and second trenches; and planarizing a top surface of the first metal layer to expose the top surface of the lower dielectric layer.

3. The method as claimed in claim 2, wherein the first metal layer is formed of a Cu layer.

4. The method as claimed in claim 2, further comprising forming a first barrier metal layer at sidewalls and bottoms of the first and second trenches before forming the first metal layer.

5. The method as claimed in claim 4, wherein the first barrier metal layer is formed of one selected from the group consisting of a Ta layer, a TaN layer, a TaSiN layer, a TiN layer, a TiSiN layer, a WN layer, a WSiN layer, and any combination thereof.

6. The method as claimed in claim 1, wherein the intermediate dielectric layer is formed of one selected from the group consisting of a SiN layer, a SiC layer, a double layer including a SiN layer and a SiOC layer, a double layer including a SiN layer and a TEOS layer, a double layer including a SiN layer and a PEOX layer, a double layer including a SiC layer and a SiOC layer, a double layer including a SiC layer and a TEOS layer, and a double layer including a SiC layer and a PEOX layer.

7. The method as claimed in claim 1, wherein forming the upper electrode of a capacitor comprises:

forming the intermediate dielectric layer on the second dielectric layer and at the sidewalls and bottom of the hole region;

forming a second metal layer to completely fill the hole region on the semiconductor substrate on which the intermediate dielectric layer is formed; and planarizing the semiconductor substrate on which the second metal layer is formed to expose a top surface of the second dielectric layer.

8. The method as claimed in claim 7, wherein the planarization is performed by chemical mechanical polishing (CMP).

9. The method as claimed in claim 7, wherein the second metal layer is formed of one selected from the group consisting of a Ta layer, a TaN layer, a TaSiN layer, a TiN layer, a TiSiN layer, a WN layer, a WSiN layer, and any combination thereof.

10. The method as claimed in claim 7, wherein the second metal layer is formed of one selected from the group consisting of a double layer including a Ta layer and a Cu layer, a double layer including a TaN layer and a Cu layer, and a triple layer including a Ta layer, a TaN layer, and a Cu layer.

11. The method as claimed in claim 1, wherein the first and third dielectric layers are formed of a SiN layer or a SiC layer.

12. The method as claimed in claim 1, wherein the second and fourth dielectric layers are formed of one selected from the group consisting of a TEOS layer, a PEOX layer, a SiOF layer, and a SiOC layer.

13. The method as claimed in claim 1, wherein forming the damascene wiring layer structure and the contact plug comprises:

forming a via trench in the fourth, third, second, and first dielectric layers to expose the top surface of the first metal wiring layer, forming a metal wiring layer region trench in the fourth and third dielectric layers and over the via trench, and forming a contact hole in the fourth and third dielectric layers to expose the top surface of the upper electrode;

forming a third metal layer to completely fill the via trench, the metal wiring layer region trench, and the contact hole; and planarizing the top surface of the third metal layer to expose a top surface of the fourth dielectric layer.

14. The method as claimed in claim 13, wherein the third metal layer is formed of a Cu layer.

15. The method as claimed in claim 13, further comprising forming a second barrier metal layer at sidewalls and bottoms of the via trench, the metal wiring layer region trench, and the contact hole before forming the third metal layer.

16. The method as claimed in claim 15, wherein the second barrier metal layer is formed of one selected from the group consisting of a Ta layer, a TaN layer, a TaSiN layer, a TiN layer, a TiSiN layer, a WN layer, a WSiN layer, and any combination thereof.

17. A method for manufacturing a semiconductor device having a metal-insulator-metal (MN) capacitor and a damascene wiring layer structure, comprising:

forming a first metal wiring layer and a second metal wiring layer in a lower dielectric on a semiconductor substrate such that top surfaces of the first and second metal wiring layers are level with a top surface of the lower dielectric layer;

forming a lower electrode of a capacitor on the second metal wiring layer before forming first and second dielectric layers;

sequentially forming the first dielectric layer and the second dielectric layer on the semiconductor substrate on which the first and second metal wiring layers and lower electrode are formed, such that the first dielectric layer and the second dielectric layer have a hole region through which a portion of the top surface of the lower electrode is exposed, and such that the first and second dielectric layers remain on the unexposed portion of the top surface of the lower electrode;

forming an upper electrode of a capacitor after forming an intermediate dielectric layer at sidewalls and a bottom of the hole region such that the hole region is completely filled with the upper electrode and a top surface of the upper electrode is level with a top surface of the second dielectric layer;

sequentially forming a third dielectric layer and a fourth dielectric layer on the semiconductor substrate on which the upper electrode is formed; and forming a damascene structure in the fourth, third, second, and first dielectric layers to contact the top surface of the first metal wiring layer and forming a contact plug in the fourth and third dielectric layers to contact the top surface of the upper electrode.

18. The method as claimed in claim 17, wherein the lower electrode of a capacitor is formed of one selected from the group consisting of a Ta layer, a TaN layer, a TaSiN layer, a TiN layer, a TiSiN layer, a WN layer, a WSiN layer, and any combination thereof.

19. A method for manufacturing a semiconductor device having a metal-insulator-metal (MN) capacitor and a damascene wiring layer structure comprising:

forming a first metal wiring layer and a second metal wiring layer in a lower dielectric layer on a semiconductor substrate such that top surfaces of the first and second metal wiring layers are level with a top surface of the lower dielectric layer;

sequentially forming a first dielectric layer and a second dielectric layer on the semiconductor substrate on which the first and second metal wiring layers are formed, such that the first dielectric layer and the second dielectric layer have a hole region with outwardly sloping sidewalls through which the top surface of the second metal wiring layer is exposed;

forming an upper electrode of a capacitor after forming an intermediate dielectric layer at sidewalls and a bottom of the hole region such that the hole region is partially filled with the upper electrode and a top surface of the upper electrode is level with a top surface of the second dielectric layer;

sequentially forming a third dielectric layer and a fourth dielectric layer on the semiconductor substrate on which the upper electrode is formed; and forming a damascene structure in the fourth, third, second, and first dielectric layers to contact the top surface of the first metal wiring layer and forming a contact plug in the fourth and third dielectric layers to contact the top surface of the upper electrode.

20. The method as claimed in claim 19, wherein forming the first and second metal wiring layers comprises:

forming a first trench and a second trench in the lower dielectric layer;

forming a first metal layer to completely fill the first and second trenches; and planarizing a top surface of the first metal layer to expose the top surface of the lower dielectric layer.

21. The method as claimed in claim 20, wherein the first metal layer is formed of a Cu layer.

22. The method as claimed in claim 20, further comprising forming a first barrier metal layer at sidewalls and bottoms of the first and second trenches before forming the first metal layer.

23. The method as claimed in claim 22, wherein the first barrier metal layer is formed of one selected from the group consisting of a Ta layer, a TaN layer, a TaSiN layer, a TiN layer, a TiSiN layer, a WN layer, a WSiN layer, and any combination thereof.

24. The method as claimed in claim 19, wherein the intermediate dielectric layer is formed of one selected from the group consisting of a SiN layer, a SiC layer, a double layer including a SiN layer and a SiOC layer, a double layer including a SiN layer and a TEOS layer, a double layer including a SiN layer and a PEOX layer, a double layer including a SiC layer and a SiOC layer, a double layer including a SiC layer and a TEOS layer, and a double layer including a SiC layer and a PEOX layer.

25. A method for manufacturing a semiconductor device having a metal-insulator-metal (MN) capacitor and a damascene wiring layer structure comprising:

forming a first metal wiring layer and a second metal wiring layer in a lower dielectric layer on a semiconductor substrate such that top surfaces of the first and second metal wiring layers are level with a top surface of the lower dielectric layer;

sequentially forming a first dielectric layer and a second dielectric layer on the semiconductor substrate on which the first and second metal wiring layers are formed, such that the first dielectric layer and the second dielectric layer have a hole region through which the top surface of the second metal wiring layer is exposed;

forming an upper electrode of a capacitor such that the hole region is partially filled with the upper electrode and a top surface of the upper electrode is level with a top surface of the second dielectric layer by:

forming an intermediate dielectric layer on the second dielectric layer and at sidewalls and a bottom of the hole region;

forming a second metal layer to partially fill the hole region on the semiconductor substrate on which the intermediate dielectric layer is formed;

forming a capping layer on the semiconductor substrate on which the second metal layer is formed;

forming a second metal layer pattern and a capping layer pattern by planarizing the semiconductor substrate, on which the capping layer is formed, to expose the top surface of the second dielectric layer; and cleaning the semiconductor substrate on which the capping layer pattern is formed;

sequentially forming a third dielectric layer and a fourth dielectric layer on the semiconductor substrate on which the upper electrode is formed; and forming a damascene structure in the fourth, third, second, and first dielectric layers to contact the top surface of the first metal wiring layer and forming a contact plug in the fourth and third dielectric layers to contact the top surface of the upper electrode.

26. The method as claimed in claim 25, wherein forming the second metal layer pattern and the capping layer pattern is performed by CMP.

27. The method as claimed in claim 25, wherein the second metal layer is formed of one selected from the group consisting of a Ta layer, a TaN layer, a TaSiN layer, a TiN layer, a TiSiN layer, a WN layer, a WSiN layer, and any combination thereof.

28. The method as claimed in claim 25, wherein the second metal layer is formed of one selected from the group consisting of a double layer including a Ta layer and a Cu layer, a double layer including a TaN layer and a Cu layer, and a triple layer including a Ta layer, a TaN layer, and a Cu layer.

29. The method as claimed in claim 25, wherein the capping layer is formed of one selected from the group consisting of a TEOS layer, a PEOX layer, a SiOF layer, and a SiOC layer.

30. The method as claimed in claim 25, wherein the capping layer completely fills the hole region.

31. The method as claimed in claim 19, wherein the first and third dielectric layers are formed of a SiN layer or a SiC layer.

32. The method as claimed in claim 19, wherein the second and fourth dielectric layers are formed of one selected from the group consisting of a TEOS layer, a PEOX layer, a SiOF layer, and SiOC layer.

33. The method as claimed in claim 19, wherein forming the damascene wiring layer structure and the contact plug comprises:

forming a via trench in the fourth, third, second, and first dielectric layers to expose the top surface of the first metal wiring layer, forming a metal wiring layer region trench in the fourth and third dielectric layers and over the via trench, and forming a contact hole in the fourth and third dielectric layers to expose the top surface of the upper electrode;

forming a third metal layer to completely fill the via trench, the metal wiring layer region trench, and the contact hole; and planarizing the top surface of the third metal layer to expose a top surface of the fourth dielectric layer.

34. The method as claimed in claim 33, wherein the third metal layer is formed of a Cu layer.

35. The method as claimed in claim 33, further comprising forming a second barrier metal layer at sidewalls and bottoms of the via trench, the metal wiring layer region trench, and the contact hole before forming the third metal layer.

36. The method as claimed in claim 35, wherein the second barrier metal layer is formed of one selected from the group consisting of a Ta layer, a TaN layer, a TaSiN layer, a TiN layer, a TiSiN layer, a WN layer, a WSiN layer, and any combination thereof.

37. A method for manufacturing a semiconductor device having a metal-insulator-metal (MIM) capacitor and a damascene wiring layer structure comprising:

forming a first metal wiring layer and a second metal wiring layer in a lower dielectric layer on a semiconductor substrate such that top surfaces of the first and second metal wiring layers are level with a top surface of the lower dielectric layer;

forming a lower electrode of a capacitor on the second metal wiring layer before forming first and second dielectric layers;

sequentially forming the first dielectric layer and the second dielectric layer on the semiconductor substrate on which the first and second metal wiring layers and the lower electrode are formed, such that the first dielectric layer and the second dielectric layer have a hole region through which a portion of the top surface of the lower electrode is exposed, and such that the first and second dielectric layers remain on the unexposed portion of the top surface of the lower electrode;

forming an upper electrode of a capacitor after forming an intermediate dielectric layer at sidewalls and a bottom of the hole region such that the hole region is partially filled with the upper electrode and a top surface of the upper electrode is level with a top surface of the second dielectric layer;

sequentially forming a third dielectric layer and a fourth dielectric layer on the semiconductor substrate on which the upper electrode is formed; and forming a damascene structure in the fourth, third, second, and first dielectric layers to contact the top surface of the first metal wiring layer and forming a contact plug in the fourth and third dielectric layers to contact the top surface of the upper electrode.

38. The method as claimed in claim 37, wherein the lower electrode of a capacitor is formed of one selected from the group consisting of a Ta layer, a TaN layer, a TaSiN layer, a TiN layer, a TiSiN layer, a WN layer, a WSiN layer, and any combination thereof.

* * * * *